United States Patent
Ito et al.

(10) Patent No.: US 12,185,467 B2
(45) Date of Patent: Dec. 31, 2024

(54) ELECTRONIC DEVICE

(71) Applicant: DENSO CORPORATION, Kariya (JP)

(72) Inventors: Keitaro Ito, Kariya (JP); Teruhisa Akashi, Kariya (JP); Hirofumi Funabashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 234 days.

(21) Appl. No.: 17/867,255

(22) Filed: Jul. 18, 2022

(65) Prior Publication Data

US 2022/0353996 A1 Nov. 3, 2022

Related U.S. Application Data

(63) Continuation of application No. PCT/JP2021/014762, filed on Apr. 7, 2021.

(30) Foreign Application Priority Data

Apr. 10, 2020 (JP) .................................. 2020-071347

(51) Int. Cl.
  *H05K 1/18* (2006.01)
(52) U.S. Cl.
  CPC ... *H05K 1/181* (2013.01); *H05K 2201/09545* (2013.01)
(58) Field of Classification Search
  CPC .................. H05K 1/189; H05K 1/181; H05K 2201/09545
  See application file for complete search history.

(56) References Cited

U.S. PATENT DOCUMENTS

| 8,045,331 B2 * | 10/2011 | Seo ...................... H05K 3/4092 |
| | | 29/841 |
| 2022/0317147 A1 | 10/2022 | Ito et al. |

FOREIGN PATENT DOCUMENTS

| JP | S60-057152 U | 4/1985 |
| JP | 2009-260068 A | 11/2009 |
| JP | 2009-272445 A | 11/2009 |
| JP | 2011-159840 A | 8/2011 |
| JP | 2012-039033 A | 2/2012 |
| JP | 2015-144228 A | 8/2015 |
| WO | WO 2016084630 A1 * | 1/2013 ............... H05K 1/02 |

OTHER PUBLICATIONS

Machine Translation of WO-2013084630-A1 (Year: 2016).*

* cited by examiner

*Primary Examiner* — Jeremy C Norris
(74) *Attorney, Agent, or Firm* — Posz Law Group, PLC

(57) ABSTRACT

An electronic device includes a component mounting portion, an electronic component disposed on the component mounting portion, a solder between the component mounting portion and the electronic component, a mounting base member, and a supporting beam connecting the component mounting portion and the mounting base member. The supporting beam has a plurality of bent portions. The supporting beam includes a frame, an outer supporting portion connecting the frame and the mounting base member, and an inner supporting portion connecting the frame and the component mounting portion. The inner supporting portion is shifted from the outer supporting portion along the frame. One of the plurality of bent portions is a connecting portion between the frame and the outer supporting portion. Another of the plurality of bent portions is a connecting portion between the frame and the inner supporting portion.

10 Claims, 9 Drawing Sheets

ELECTRONIC DEVICE

CROSS REFERENCE TO RELATED APPLICATION

The present application is a continuation application of International Patent Application No. PCT/JP2021/014762 filed on Apr. 7, 2021, which designated the U.S. and claims the benefit of priority from Japanese Patent Application No. 2020-071347 filed on Apr. 10, 2020. The entire disclosures of all of the above applications are incorporated herein by reference.

TECHNICAL FIELD

The present disclosure relates to an electronic device in which an electronic component is arranged in a component mounting portion via solder.

BACKGROUND

For example, an electronic device in which an electronic component is arranged in a component mounting portion via solder is proposed. Specifically, in this electronic device, solder is disposed between the electronic component and the component mounting portion, and a metal pin is disposed to connect the outer edge portion of the electronic component and the component mounting portion.

SUMMARY

According to one aspect of the present disclosure, an electronic device includes a component mounting portion, an electronic component disposed on the component mounting portion, a solder between the component mounting portion and the electronic component, a mounting base member mounted in a housing, and a supporting beam connecting the component mounting portion and the mounting base member such that the component mounting portion is supported by the mounting base member via the supporting beam. The supporting beam has a plurality of bent portions that are bent. The supporting beam includes a frame surrounding the component mounting portion and including at least one of the plurality of bent portions, an outer supporting portion connecting the frame and the mounting base member, and an inner supporting portion connecting the frame and the component mounting portion. The inner supporting portion is shifted from the outer supporting portion along the frame. One of the plurality of bent portions is a connecting portion between the frame and the outer supporting portion, and another of the plurality of bent portions is a connecting portion between the frame and the inner supporting portion.

According to another aspect of the present disclosure, an electronic device includes an electronic mounting portion, an electronic component, a solder between the component mounting portion and the electronic component, a mounting base member mounted in a housing, and a supporting beam connecting the component mounting portion and the mounting base member such that the component mounting portion is supported by the mounting base member via the supporting beam. The supporting beam has a plurality of supporting beam portions each having three bent portions. An extending direction of each of the plurality of supporting beam portions is changed by 90 degrees at the three bent portions.

DESCRIPTION OF EMBODIMENTS

Figure 1:
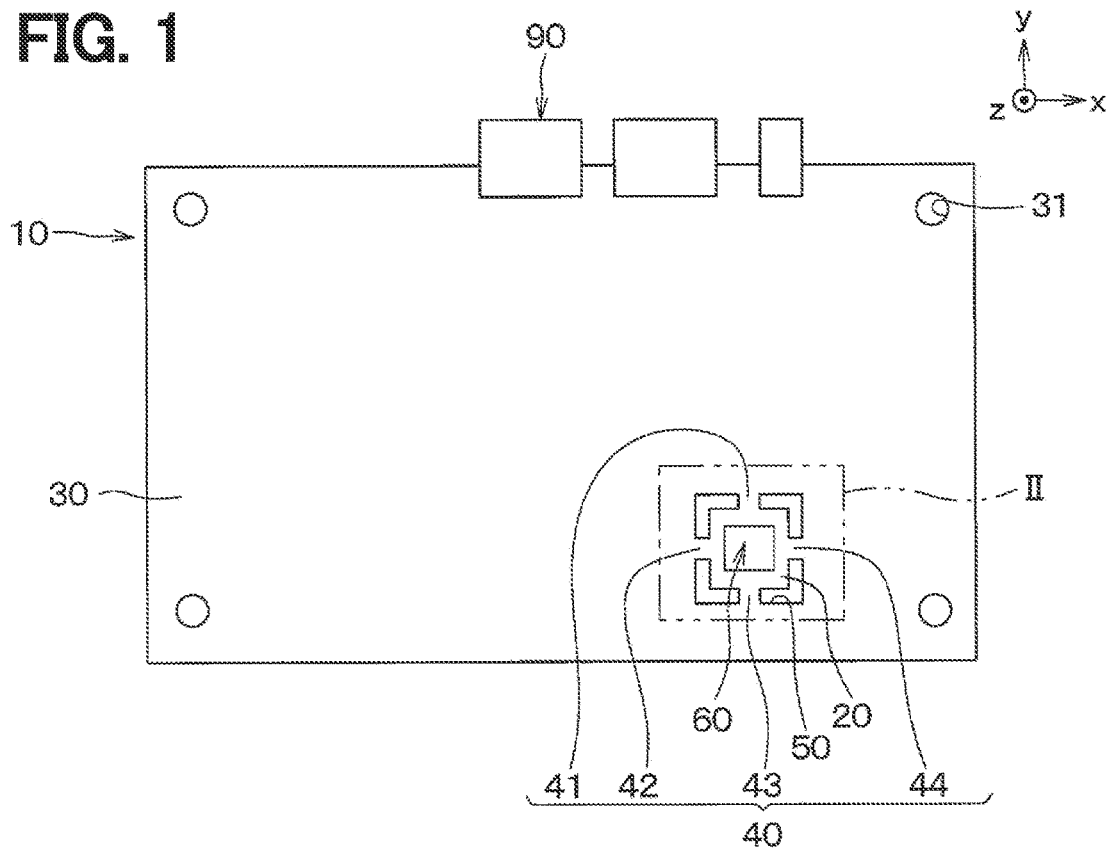
FIG. 1 is a plan view of an electronic device of a first embodiment.

To begin with, examples of relevant techniques will be described.

For example, an electronic device in which an electronic component is arranged in a component mounting portion via solder is proposed. Specifically, in this electronic device, solder is disposed between the electronic component and the component mounting portion, and a metal pin is disposed to connect the outer edge portion of the electronic component and the component mounting portion. The component mounting portion defines a recess into which the metal pin can be inserted. The height of the metal pin is higher than that of the solder, and the metal pin is connected to both the electronic component and a low-melting point solder disposed in the recess. In this electronic device, when the component mounting portion warps, the metal pin can relief this warp and reduce stress applied to the solder between the electronic component and the component mounting portion.

However, in the above-mentioned electronic device, warp of the component mounting portion itself cannot be sufficiently suppressed. Thus, stress applied to the solder may not be sufficiently reduced.

It is an objective of the present disclosure to provide an electronic device that can sufficiently reduce stress applied to solder.

According to an aspect of the present disclosure, an electronic device includes an electronic mounting portion, an electronic component, a solder between the component mounting portion and the electronic component, a mounting base member mounted in a housing, and a supporting beam connecting the component mounting portion and the mounting base member such that the component mounting portion is supported by the mounting base member via the supporting beam.

According to this, since the component mounting portion is supported by the mounting base member via the supporting beam, even when the mounting base member warps, strain energy due to this warp is less likely to propagate to the component mounting portion through the supporting beam. Therefore, it is possible to restrict the component mounting portion from warping and reduce stress applied to the solder.

Hereinafter, embodiments of the present disclosure will be described with reference to the drawings. In the following embodiments, the same or equivalent parts are denoted by the same reference numerals.

First Embodiment

Figure 2:
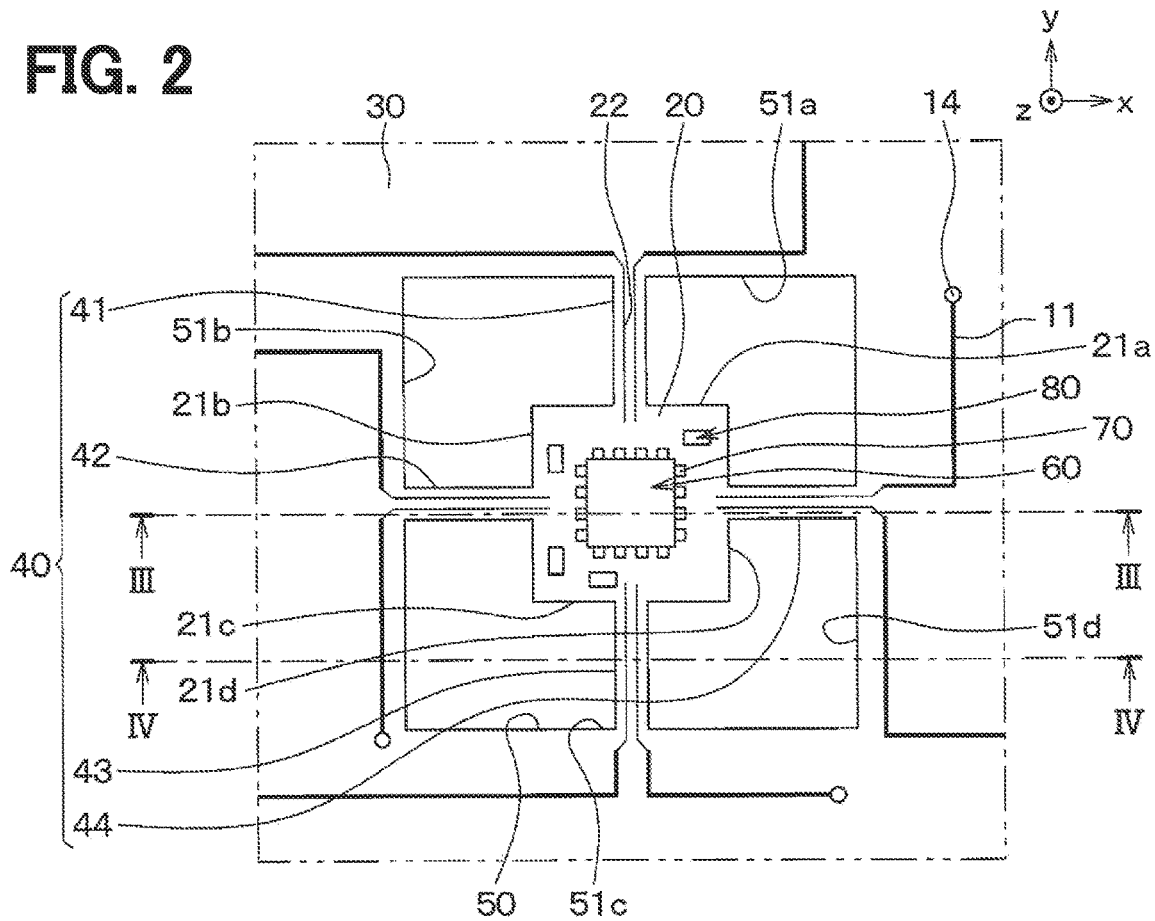
FIG. 2 is an enlarged view of an area II in FIG. 1.
Figure 3:
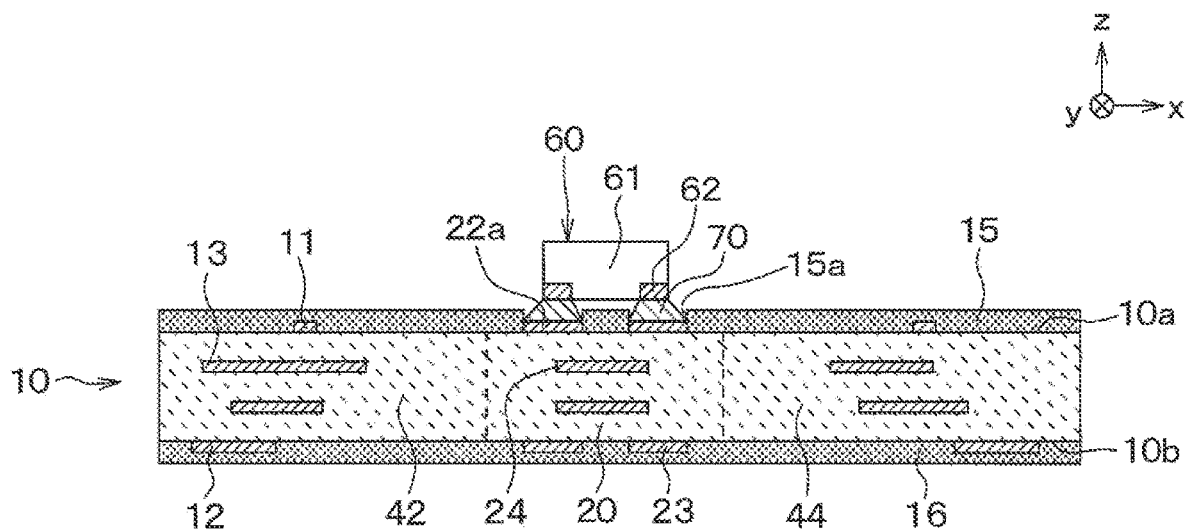
FIG. 3 is a cross-sectional view taken along a line III-III shown in FIG. 2.
Figure 4:
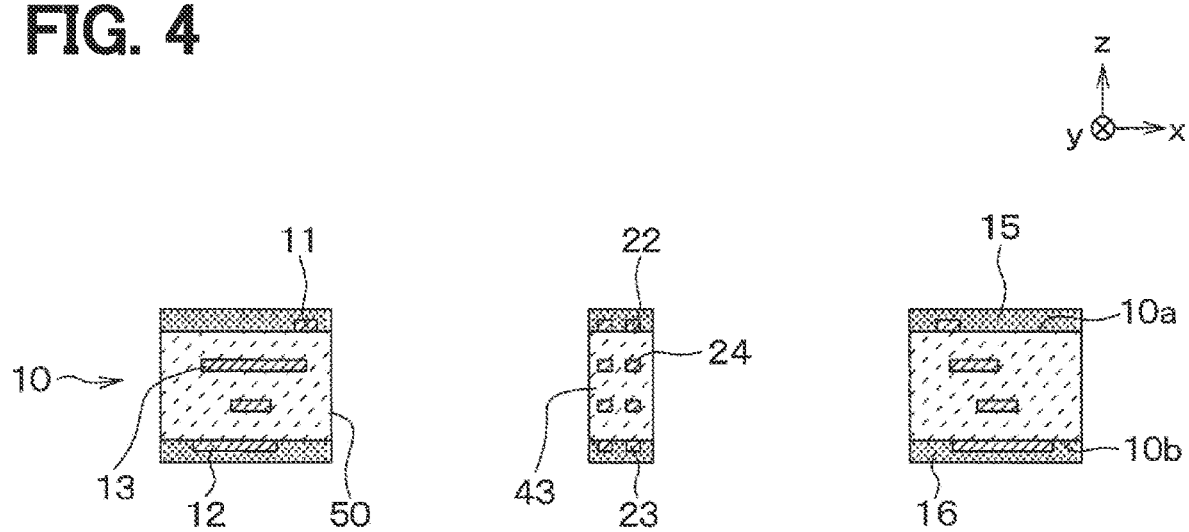
FIG. 4 is a cross-sectional view taken along a line IV-IV shown in FIG. 2.

An electronic device according to a first embodiment will be described with reference to the drawings. As shown in FIGS. 1 to 4, the electronic device includes a printed circuit board 10 as a mounting base member and an electronic component 60. In FIG. 2, for descriptive purpose, an illustration of an insulating film 15, which will be described later, is omitted and a wiring pattern 11 covered by the insulating film 15 and the like are shown in a solid line. Further, in the following, one direction in the plane direction of the printed circuit board 10 is defined as an x-axis direction, a direction in the plane direction perpendicular to the x-axis direction is defined as a y-axis direction, and a direction perpendicular to both of the x-axis direction and the y-axis direction is defined as a z-axis direction.

The printed circuit board 10 of the present embodiment is a multi-layer wiring board formed with a glass epoxy board. The printed circuit board 10 has one surface 10a on which wiring patterns 11 and 22 are formed and the other surface 10b on which wiring patterns 12 and 23 are formed. The printed circuit board 10 further includes wiring layers 13 and 24 therein. The wiring patterns 11 and 22 formed on the one surface 10a, the wiring patterns 12 and 23 formed on the other surface 10b and the wiring layers 13 and 24 formed inside the printed circuit board 10 are appropriately connected via through-vias 14.

As will be described later, the printed circuit board 10 of this embodiment has a component mounting portion 20, a peripheral portion 30, and a supporting beam 40. In the following, the wiring patterns formed in the peripheral portion 30 will be referred to as the wiring patterns 11 and 12, and the wiring layer formed in the peripheral portion 30 will be referred to as the wiring layer 13. Further, in the following, the wiring patterns formed on the component mounting portion 20 and the supporting beam 40 will be referred to as the wiring patterns 22 and 23, and the wiring layer formed in the component mounting portion 20 and the supporting beam 40 will be referred to as the wiring layer 24.

The insulating film 15 formed of a solder resist and the like is formed on the one surface 10a and an insulating film 16 formed of a solder resist and the like is formed on the other surface 10b. For example, the insulating film 15 defines contact holes 15a in the component mounting portion 20 such that lands 33a that is connected to the electronic component 60 are exposed through the contact holes 15a.

The printed circuit board 10 of the present embodiment has the component mounting portion 20, the peripheral portion 30 and the supporting beam 40 that are partitioned from one another. That is, in the present embodiment, each of the component mounting portion 20, the peripheral portion 30, and the supporting beam 40 is formed of a part of the printed circuit board 10 and located on the same surface.

Specifically, the component mounting portion 20 is arranged an inner area of the printed circuit board 10 while the component mounting portion 20 are partitioned from the peripheral portion 30, and a board through-hole 50 is defined to pass through the printed circuit board 10 in the thickness direction such that the supporting beam 40 is formed between the component mounting portion 20 and the peripheral portion 30. More specifically, the board through-hole 50 is formed such that the component mounting portion 20 has a square shape (i.e., a rectangular shape) when viewed in a normal direction relative to the one surface 10a of the printed circuit board 10 (hereinafter, simply referred to as a normal direction). The component mounting portion 20 has first to fourth mounting portion sides 21a to 21d. In the present embodiment, in the component mounting portion 20, the first and third mounting portion sides 21a and 21c are parallel to the x-axis direction, and the second and fourth sides 21b and 21d are parallel to the y-axis direction.

Further, the board through-hole 50 is an opening that has a substantially square outer shape (i.e., a rectangular shape) having first to fourth hole portion sides 51a to 51d in a plan view in the normal direction. The center of the board through-hole 50 is arranged at substantially the same as the center of the component mounting portion 20. The board through-hole 50 is arranged such that the first hole portion side 51a faces the first mounting portion side 21a and the second hole portion side 51b faces the second mounting portion side 21b. The board through-hole 50 is arranged such that the third hole portion side 51c faces the third mounting portion side 21c and the fourth hole portion side 51c faces the fourth mounting portion side 21d. Further, the board through-hole 50 is formed such that the first and third hole portion sides 51a and 51c are parallel to the first and third mounting portion sides 21a and 21c and the second and the fourth hole portion sides 51b and 51d are parallel to the second and fourth mounting portion sides 21b and 21d. That is, the board through-hole 50 is formed such that the first and the third hole portion sides 51a and 51c are parallel to the x-axis direction and the second and the fourth hole portion sides 51b and 51d are parallel to the y-axis direction.

Further, the board through-hole 50 is arranged such that the supporting beam 40 connects the component mounting portion 20 and the peripheral portion 30. The component mounting portion 20 is supported by the peripheral portion 30 through the supporting beam 40. In the present embodiment, the supporting beam 40 includes first to fourth supporting beam portions 41 to 44. Each of the first to fourth supporting beam portions 41 to 44 has a straight shape extending in one direction as an extending direction. The first to fourth supporting beam portions 41 to 44 have the same shapes and the same dimensions with one another.

The first to fourth supporting beam portions 41 to 44 are disposed to connect the first to fourth mounting portion sides 21a to 21d of the component mounting portion 20 and the first to fourth hole portion sides 51a to 51d of the board through-hole 50. That is, the component mounting portion 20 is supported by the peripheral portion 30 at four sides through the first to fourth supporting beam portions 41 to 44.

Specifically, the first supporting beam portion 41 has one end connected to the first mounting portion side 21a and the other end connected to the first hole portion side 51a. The second supporting beam portion 42 has one end connected to the second mounting portion side 21b and the other end connected to the second hole portion side 51b. The third supporting beam portion 43 has one end connected to the third mounting portion side 21c and the other end connected to the third hole portion side 51c. The fourth supporting beam portion 44 has one end connected to the fourth mounting portion side 21d and the other end connected to the fourth hole portion side 51d.

Further, the first to fourth supporting beam portions 41 to 44 are arranged so as to be point-symmetrical with respect to the center of the component mounting portion 20. Further, the first to fourth supporting beam portions 41 to 44 are arranged so as to be line-symmetrical with respect to a virtual line extending in the x-axis direction and passing through the center of the component mounting portion 20 and a virtual line extending in the y-axis direction and passing through the center of the component mounting portion 20. In the present embodiment, the one ends of the first to fourth supporting beam portions 41 to 44 are connected respectively to the centers of the first to fourth mounting portion sides 21a to 21d of the component mounting portion 20 and the other ends of the first to fourth supporting beam portions 41 to 44 are connected respectively to the centers of the first to fourth hole portion sides 51a to 51d.

The first to fourth supporting beam portions 41 to 44 are formed of a part of the printed circuit board 10, so that the first to fourth supporting beam portions 41 to 44 have the same thickness as that of the peripheral portion 30. However, each of the first to fourth supporting beam portions 41 to 44 has a cross-sectional area that is sufficiently smaller compared to a part of the peripheral portion 30 to which the first to fourth supporting beam portions 41 to 44 are connected. For example, the first supporting beam portion 41 has a cross-sectional area along the x-axis direction that is sufficiently smaller than a portion of the peripheral portion 30 to which the first supporting beam portion 41 is connected.

The first to fourth supporting beam portions 41 to 44 are formed of a part of the printed circuit board 10 as described above. In the first to fourth supporting beam portions 41 to 44 of the present embodiment, the wiring patterns 22 and 23, the shape of the wiring layer 24, and the like are adjusted so that the configuration of the one surface 10a of the printed circuit board 10 and the configuration of the other surface 10b of the printed circuit board 10 are symmetrical relative to each other. Although the illustrations of the wiring pattern 22 formed around the electronic component 60, which will be described later, is omitted in FIG. 2, the wiring pattern 22 is formed to be connected to the land 22a to which the electronic component 60 is connected, actually. Similarly, in each figure corresponding to FIG. 2 described later, the illustrations of the wiring pattern 22 formed around the electronic component 60 is appropriately omitted.

The electronic component 60 is a QFN (abbreviation for quad flat non-leaded package) in which, for example, an IC (abbreviation for integrated circuit) chip or the like is housed in a case 61 and a plurality of terminal portions 62 are formed on the back surface of the case 61.

The electronic component 60 is joined to the lands 22a formed on the component mounting portion 20 via a solder 70. In the present embodiment, the electronic component 60 is arranged in a substantially central portion of the component mounting portion 20. However, the electronic component 60 may be arranged close to the outer edge of the component mounting portion 20, and the position where the electronic component 60 is arranged is not particularly limited. Further, an external component 80 such as a chip resistor and a chip capacitor is also arranged on the component mounting portion 20.

Although not particularly shown, these external components 80 are joined to the lands formed on the component mounting portion 20 via a solder. Further, thermal stress generated when the solder 70 is arranged in a reflow process or the like is applied to the solder 70.

On the peripheral portion 30, a socket 90 for connecting the electronic device to another circuit unit is mounted. Further, the peripheral portion 30 defines screw holes 31 through which screws for fixing the printed circuit board 10 to a housing formed of aluminum alloy and the like pass.

The electronic device according to the present embodiment has been described in terms of its configuration. For example, such electronic device is screw-fixed to the housing by inserting screws into the screw holes 31 defined in the peripheral portion 30, and a metal lid is attached to the housing to accommodate the electronic device. Thereby, in-vehicle component is formed. Then, this in-vehicle component is mounted in a vehicle by mechanically fixing the housing to the vehicle and used for executing various controls of the vehicle.

In the present embodiment described above, the component mounting portion 20 is supported by the peripheral portions 30 through the first to fourth supporting beam portions 41 to 44. The cross-sectional areas of the first to fourth supporting beam portions 41 to 44 are sufficiently smaller than those of the peripheral portions 30 to which the first to fourth supporting beam portions 41 to 44 are connected. Therefore, even when the peripheral portion 30 of the printed circuit board 10 warps around the x-axis direction or around the y-axis direction, strain energy due to this warp is inhibited from propagating to the component mounting portion 20 through the first to fourth supporting beam portions 41 to 44. Thus, the component mounting portion 20 can be restricted from warping. In other words, even when the peripheral portion 30 of the printed circuit board 10 warps, the strain energy due to this warp is absorbed by the first to fourth supporting beam portions 41 to 44 and the warp of the component mounting portion 20 can be avoided. Therefore, it is possible to inhibit stress due to the warp from being applied to the solder 70. That is, the solder 70 can be avoided receiving stress other than the thermal stress generated when the solder 70 is arranged. Therefore, it is possible to restrict new stress from being applied to the solder 70 and cracks from generating, so that it is possible to extend the life of the solder 70.

"That the peripheral portion 30 of the printed circuit board 10 warps" means that the peripheral portion 30 warps due to strain energy generated when the printed circuit board 10 is attached to the housing and the like, or strain energy generated according to the temperature change in the usage environment. That is, according to the electronic device of the present embodiment, even when the peripheral portion 30 of the printed circuit board 10 warps due to the strain energy, stress due to this warp is inhibited from applying to the solder 70.

Further, the supporting beam 40 has the first to fourth supporting beam portions 41 to 44. The supporting beam 40 is connected to the component mounting portion 20 at a plurality of positions and is connected to the peripheral portion 30 at a plurality of positions. That is, opposite ends of the component mounting portion 20 are supported by the supporting beam 40. Therefore, it is possible to prevent the component mounting portion 20 from tilting.

Further, in the present embodiment, the first to fourth supporting beam portions 41 to 44 are arranged point-symmetrically with respect to the center of the component mounting portion 20. Further, the first to fourth supporting beam portions 41 to 44 are arranged line-symmetrical with respect to a virtual line passing through the center of the component mounting portion 20 and extending in the x-axis direction and a virtual line passing through the center of the component mounting portion 20 and extending in the y-axis direction. Therefore, it is possible to further prevent the component mounting portion 20 from tilting.

Further, in the electronic device of the present embodiment, as described above, stress applied to the solder 70 is reduced by suppressing the warp of the component mounting portion 20. Therefore, it is possible to improve the degree of freedom in arranging the electronic component 60 on the component mounting portion 20. That is, for example, the electronic component 60 can be arranged on the outer edge portion of the component mounting portion 20.

By the way, in order to reduce stress applied to the solder 70, a resin material such as a side fill may be arranged around the solder 70. However, this method requires to coat the solder 70 with a liquid constituent material and solidify the constituent material to form the side fill. Thus, fine controls are required to adjust the shape of the side fill and the manufacturing step may be complicated. In contrast, in the electronic device of the present embodiment, as described above, the stress applied to the solder 70 is reduced by the supporting beam 40 inhibiting the component mounting portion 20 from warping. Therefore, it is not necessary to dispose a resin material such as a side fill around the solder 70, and it is possible to avoid the complicated manufacturing process.

Further, the component mounting portion 20 and the first to fourth supporting beam portions 41 to 44 are formed by defining the board through-hole 50 in the printed circuit board 10. That is, the component mounting portion 20 and the first to fourth supporting beam portions 41 to 44 are formed of a part of the printed circuit board 10, which means the component mounting portion 20, the first to fourth supporting beam portions 41 to 44, and the printed circuit board 10 are made of the same material. Therefore, as compared with the case where the component mounting portion 20 and the first to fourth supporting beam portions 41 to 44 are made of materials different from the material of the printed circuit board 10, it is possible to reduce the number of members and suppress the complexity of the manufacturing process, which in turn leads to cost reduction.

The component mounting portion 20 is arranged in the board through-hole 50, and the size of the component mounting portion 20 tends to be small. Further, the component mounting portion 20 is arranged with partitioned from the peripheral portion 30. Therefore, the expansion and contraction of the component mounting portion 20 due to the temperature change in the usage environment tends to be small, and the stress applied to the solder 70 tends to be small. Therefore, also in this respect, the stress applied to the solder 70 can be reduced, and the life of the solder 70 can be extended.

Second Embodiment

A second embodiment will be described. In the present embodiment, the configuration of the supporting beam 40 is changed from that of the first embodiment. The remaining configurations are similar to those of the first embodiment and will thus not be described repeatedly.

Figure 5:
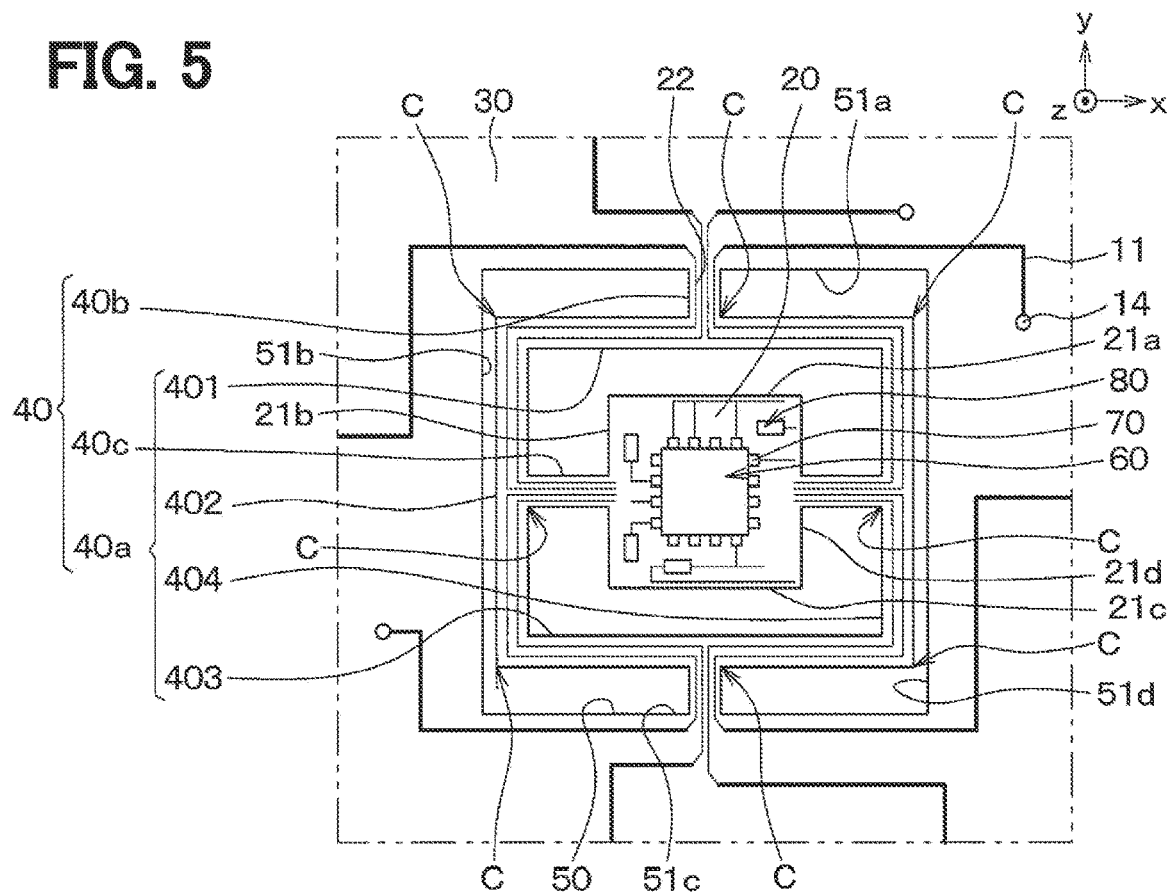
FIG. 5 is a plan view of an electronic device of a second embodiment.

In the present embodiment, as shown in FIG. 5, the supporting beam 40 has a frame 40a, outer supporting portions 40b and inner supporting portions 40c. Note that FIG. 5 corresponds to an enlarged view of the area II shown in FIG. 1.

Specifically, the frame 40a has first to fourth portions 401 to 404 each having a straight shape. The first portion 401 is arranged parallel to the x-axis direction between the first mounting portion side 21a and the first hole portion side 51a. The second portion 402 is arranged parallel to the y-axis direction between the second mounting portion side 21b and the second hole portion side 51b. The third portion 403 is arranged parallel to the x-axis direction between the third mounting portion side 21c and the third hole portion side 51c. The fourth portion 404 is arranged parallel to the y-axis direction between the fourth mounting portion side 21b and the fourth hole portion side 51d.

The frame 40a is formed of the first to fourth portions 401 to 404 integrally formed with each other and has a rectangular frame shape. That is, the frame 40a has bent portions C at connecting portions at which the first to fourth portions 401 to 404 are connected to one another. The frame 40a curves at each of the bent portions C in a direction perpendicular to an extending direction.

The number of the outer supporting portions 40b is two and each of the outer supporting portions 40b has a straight shape. One of the outer supporting portions 40b is arranged along the y-axis direction and connects the center portion of the first hole portion side 51a and the center portion of the first portion 401. The other of the outer supporting portions 40b is arranged along the y-axis direction and connects the center portion of the third hole portion side 51c and the center portion of the third portion 403.

The number of the inner supporting portions 40c is two and each of the other inner supporting portions 40c has a straight shape. One of the inner supporting portions 40c is arranged along the x-axis direction and connects the center portion of the second mounting portion side 21b and the center portion of the second portion 402. The other of the inner supporting portions 40c is arranged along the x-axis direction and connects the center portion of the fourth mounting portion side 21d and the center portion of the fourth portion 404.

That is, the supporting beam 40 of the present embodiment has a so-called gimbal structure. The supporting beam 40 of the present embodiment is arranged so as to be point-symmetrical with respect to the center of the component mounting portion 20. Further, the supporting beam 40 of the present embodiment is arranged to be line-symmetrical with respect to a virtual line passing through the center of the component mounting portion 20 and extending in the x-axis direction and a virtual line passing through the center of the component mounting portion 20 and extending in the y-axis direction.

In the present embodiment, the two outer supporting portions 40b are connected to the peripheral portion 30 and the two inner supporting portions 40c are connected to the component mounting portion 20. The inner supporting portions 40c are shifted from the outer supporting portion 40b along the frame 40a. Thus, opposite sides of the component mounting portion 20 are supported.

In the present embodiment, the frame 40a and the outer supporting portion 40b are connected to each other as described above, so that connecting portions between the frame 40a and the outer supporting portions 40b are bent portions C. The extending direction of the supporting beam 40 is changed by 90 degrees at the bent portions C. Similarly, the frame 40a and the inner supporting portion 40c are connected to each other as described above, so that connecting portions between the frame 40a and the inner supporting portions 40c are bent portions C. The extending direction of the supporting beam 40 is changed by 90 degrees at the bent portions C.

In the present embodiment described above, the supporting beam 40 has the bent portions C. Therefore, when the printed circuit board 10 warps, the strain energy to propagate from the printed circuit board 10 through the supporting beam 40 is likely to be concentrated on the bent portions C of the supporting beam 40, and is less likely to propagate to reach the component mounting portion 20. Therefore, it is possible to further restrict the component mounting portion 20 from warping and further reduce the stress applied to the solder 70.

Further, since the supporting beam 40 has the bent portions C, it is easy to increase the length of the supporting beam 40 as compared with the case where the component mounting portion 20 and the peripheral portion 30 are connected by the supporting beam 40 having a straight shape. Therefore, the strain energy propagating from the printed circuit board 10 through the supporting beam 40 is more likely to be absorbed in the supporting beam 40. Therefore, it is possible to further restrict the component mounting portion 20 from warping and further reduce the stress applied to the solder 70.

Third Embodiment

A third embodiment will be described. In the present embodiment, the configuration of the supporting beam 40 is changed from that of the first embodiment. The remaining configurations are similar to those of the first embodiment and will thus not be described repeatedly.

Figure 6:
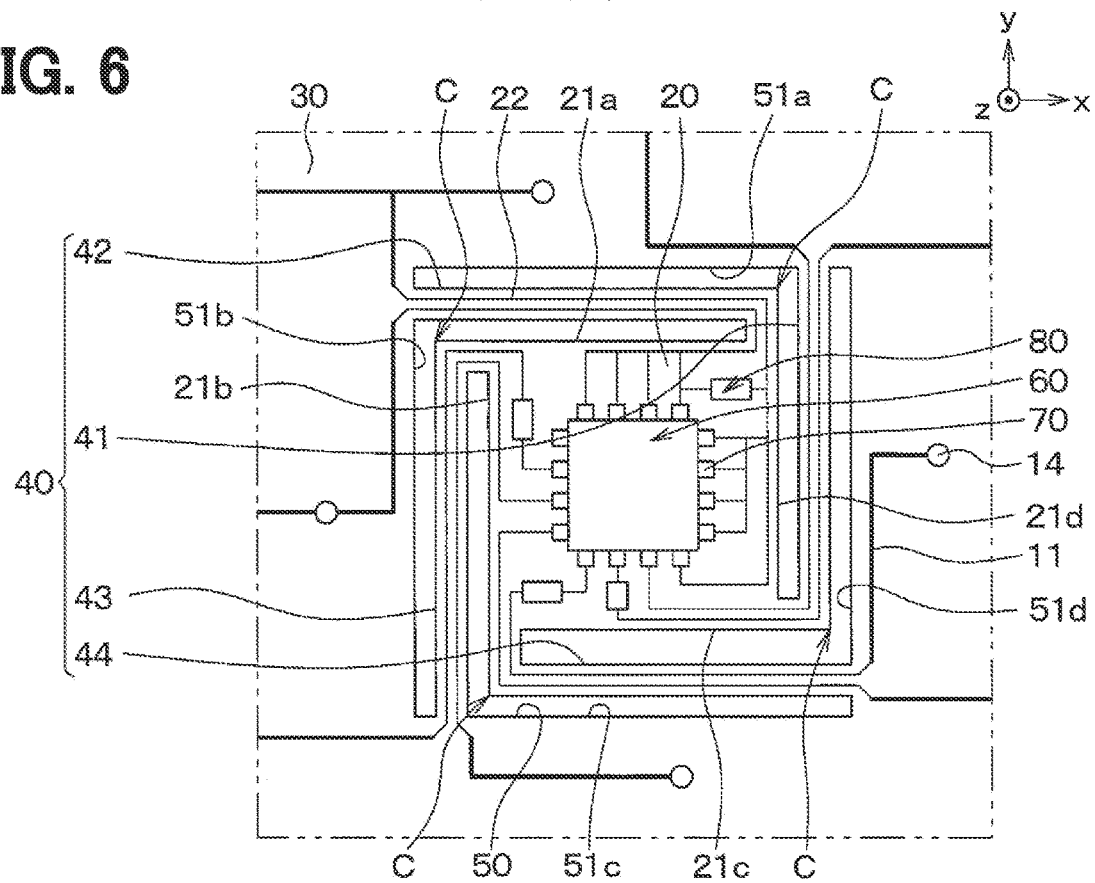
FIG. 6 is a plan view of an electronic device of a third embodiment.

In the present embodiment, as shown in FIG. 6, the supporting beam 40 has first to fourth supporting beam portions 41 to 44 each having a bent portion C where extending direction changes. Specifically, each of the first to fourth supporting beam portions 41 to 44 have one bent portion C and extending direction of each of the first to fourth supporting beam portions 41 to 44 changes by 90 degrees at the bent portion C. Note that FIG. 6 corresponds to an enlarged view of the area II shown in FIG. 1.

The first supporting beam portion 41 has one end connected to an end of the fourth mounting portion side 21d that is close to the third hole portion side 51c and the other end connected to a portion of the first hole portion side 51a that is offset from the first mounting portion side 21a in the x direction. The second supporting beam portion 42 has one end connected to an end portion of the first mounting portion side 21a that is close to the fourth hole portion side 51d and the other end connected to a portion of the second hole portion side 51b that is offset from the second mounting portion side 21b in the y direction.

The third supporting beam portion 43 has one end connected to an end of the second mounting portion side 21b that is close to the first hole portion side 51a and the other end connected to a portion of the third hole portion side 51c that is offset from the third mounting portion side 21c in the x direction. The fourth supporting beam portion 44 has one end connected to an end of the third mounting portion side 21c that is close to the second hole portion side 51b and the other end connected to a portion of the fourth hole portion side 51d that is offset from the fourth mounting portion side 21d in the y direction.

That is, the supporting beam 40 has a so-called swastika structure. The supporting beam 40 of the present embodiment is arranged so as to be point-symmetrical with respect to the center of the component mounting portion 20.

In the present embodiment described above, since each of the first to fourth supporting beam portions 41 to 44 has the bent portion C, the same advantages as those of the second embodiment can be obtained.

Fourth Embodiment

A fourth embodiment will be described. In the present embodiment, the configuration of the supporting beam 40 is changed from that of the third embodiment. The remaining configurations are similar to those of the first embodiment and will thus not be described repeatedly.

Figure 7:
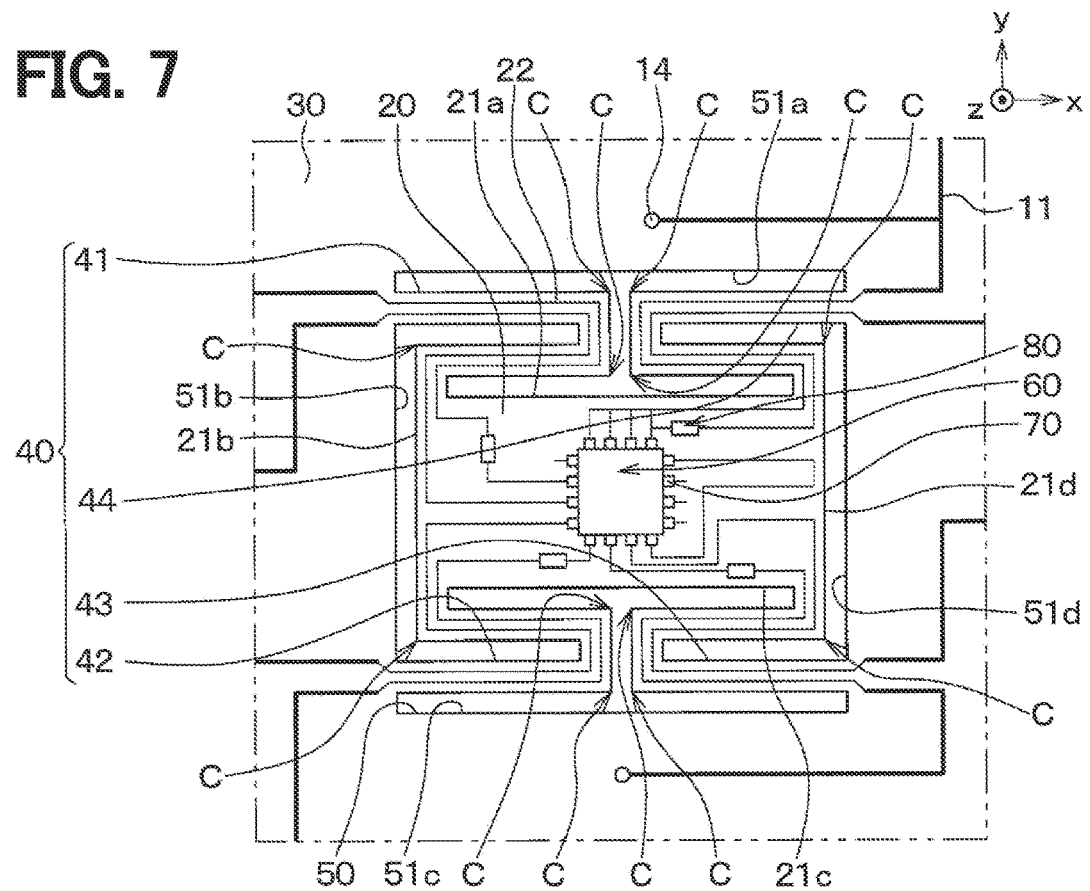
FIG. 7 is a plan view of an electronic device of a fourth embodiment.

In the present embodiment, as shown in FIG. 7, each of the first to fourth supporting beam portions 41 to 44 has three bent portions C, and the extending direction of each of the first to fourth supporting beam portions 41 to 44 changes by 90 degrees at the bent portions C. Note that FIG. 7 corresponds to an enlarged view of the area II shown in FIG. 1.

Then, the first supporting beam portion 41 has one end connected to an end of the first mounting portion side 21a that is close to the second opening portion end 51b and the other end connected to a portion of the second hole portion side 51b that is offset from the second mounting portion side 21b in they direction. The second supporting beam portion 42 has one end connected to an end of the third mounting portion side 21c that is close to the second hole portion side 51b and the other end connected to a portion of the second hole portion side 51b that is offset from the second mounting portion side 21b in the y direction.

The third supporting beam portion 43 has one end connected to an end of the third mounting portion side 21c that is close to the fourth hole portion side 51d and the other end connected to a portion of the fourth hole portion side 51d that is offset from the fourth mounting portion side 21d in the y direction. The fourth supporting beam portion 44 has one end connected to an end of the first mounting portion side 21a that is close to the fourth hole portion side 51d and the other end connected to a portion of the fourth hole portion side 51d that is offset from the fourth mounting portion side 21d in the y direction.

The first to fourth supporting beam portions 41 to 44 are bent so that the length in the x-axis direction is longer than the length in the y-axis direction. The supporting beam 40 of the present embodiment is arranged so as to be point-symmetrical with respect to the center of the component mounting portion 20. Further, the supporting beam 40 of the present embodiment is arranged to be line-symmetrical with respect to a virtual line passing through the center of the component mounting portion 20 and extending in the x-axis direction and a virtual line passing through the center of the component mounting portion 20 and extending in the y-axis direction.

Further, in the present embodiment, the component mounting portion 20 has a planar rectangular shape having the first mounting portion side 21a and the third mounting portion side 21c as long sides. That is, the component mounting portion 20 has a planar rectangular shape having, as the long sides, the first mounting portion side 21a to which the first and fourth supporting beam portions 41 and 44 are connected, and the third mounting portion side 21c to which the second and third supporting beam portions 42 and 43 are connected.

In the present embodiment described above, each of the first to fourth supporting beam portions 41 to 44 are configured to have three bent portions C. Therefore, when the printed circuit board 10 warps, the strain energy propagating from the printed circuit board 10 through the first to fourth supporting beam portions 41 to 44 tends to be concentrated on the three bent portions C of the supporting beam 40, so that the strain energy is further prevented from propagating to the component mounting portion 20. Therefore, it is possible to further restrict the component mounting portion 20 from warping and further reduce the stress applied to the solder 70.

Further, in the present embodiment, the component mounting portion 20 has a planar rectangular shape having, as the long sides, the first mounting portion side 21a to which the first and fourth supporting beam portions 41 and 44 are connected, and the third mounting portion side 21c to which the second and third supporting beam portions 42 and 43 are connected. Therefore, the lengths of the first to fourth supporting beam portions 41 to 44 in the x-axis direction can be easily increased, and strain energy can be easily absorbed in the first to fourth supporting beam portions 41 to 44. Therefore, it is possible to further restrict the component mounting portion 20 from warping and further reduce the stress applied to the solder 70.

Fifth Embodiment

A fifth embodiment will be described. In the present embodiment, the configuration of the supporting beam 40 is changed from that of the first embodiment. The remaining configurations are similar to those of the first embodiment and will thus not be described repeatedly.

Figure 8:
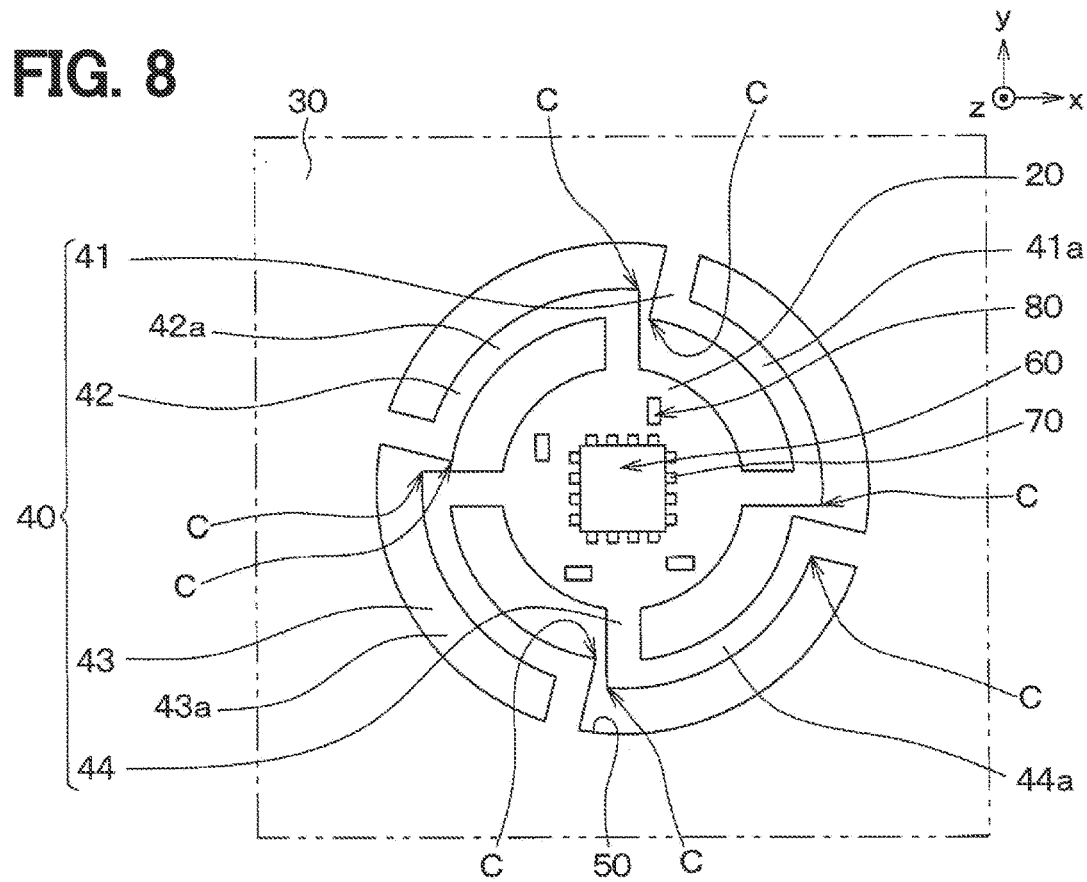
FIG. 8 is a plan view of an electronic device of a fifth embodiment.

In the present embodiment, as shown in FIG. 8, the component mounting portion 20 has a circular shape when viewed in the normal direction. Further, the board through-hole 50 has a circular shape that is coaxial with the outer shape of the component mounting portion 20. Note that FIG. 8 corresponds to an enlarged view of the area II shown in FIG. 1. Further, in FIG. 8, illustrations of the wiring pattern 22 and the like formed on the component mounting portion 20 and the like are also omitted.

The component mounting portion 20 is supported by the peripheral portion 30 through the first to fourth supporting beam portions 41 to 44. In the present embodiment, each of the first to fourth supporting beam portions 41 to 44 has a curved portion 41a to 44a and two bent portions C at both ends of the curved portion 41a to 44a. The extending direction of each of the first to fourth supporting beam portions 41 to 44 is changed at the bent portions C. The first to fourth supporting beam portions 41 to 44 are arranged so as to be point-symmetrical with respect to the center of the component mounting portion 20.

Even when the component mounting portion 20 has a circular shape as in the present embodiment described above, the same advantages as those of the first embodiment can be obtained. Further, since the first to fourth supporting beam portions 41 to 44 have the bent portions C, the component mounting portion 20 can be further prevented from warping as in the second embodiment, and the stress applied to the solder 70 can be further reduced.

Sixth Embodiment

A sixth embodiment will be described. In the present embodiment, the configuration of the supporting beam 40 is changed from that of the first embodiment. The remaining configurations are similar to those of the first embodiment and will thus not be described repeatedly.

Figure 9:
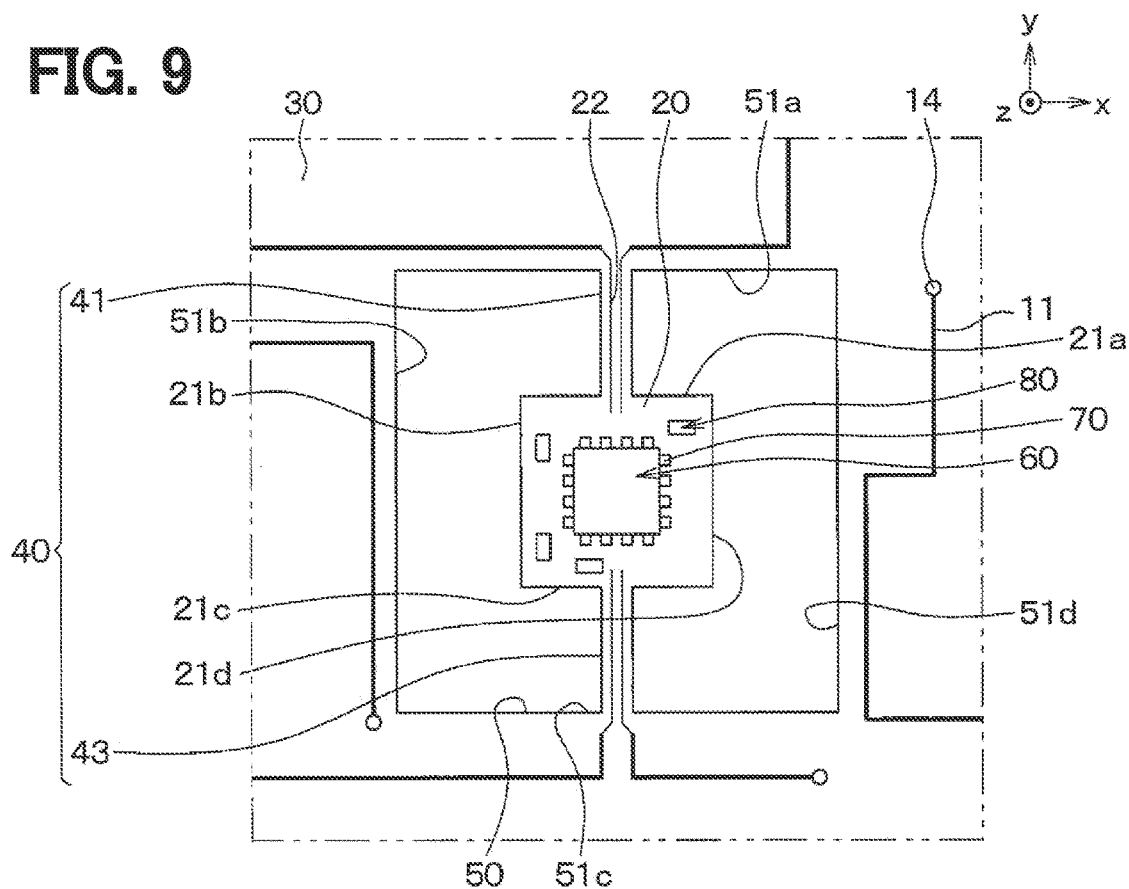
FIG. 9 is a plan view of an electronic device of a sixth embodiment.

In the present embodiment, as shown in FIG. 9, the supporting beam 40 has the first supporting beam portion 41 and the third supporting beam portion 43. That is, the electronic device of the present embodiment does not have the second supporting beam portion 42 and the fourth supporting beam portion 44 in the first embodiment. Note that FIG. 9 corresponds to an enlarged view of the area II shown in FIG. 1.

As in the present embodiment described above, even when the supporting beam 40 has only the first and third supporting beam portions 41 and 43, the opposite ends of the component mounting portions 20 are supported, so that advantages similar to those of the first embodiment can be obtained.

Seventh Embodiment

A seventh embodiment will be described. In the present embodiment, the configuration of the supporting beam 40 is changed from that of the first embodiment. The remaining configurations are similar to those of the first embodiment and will thus not be described repeatedly.

Figure 10:
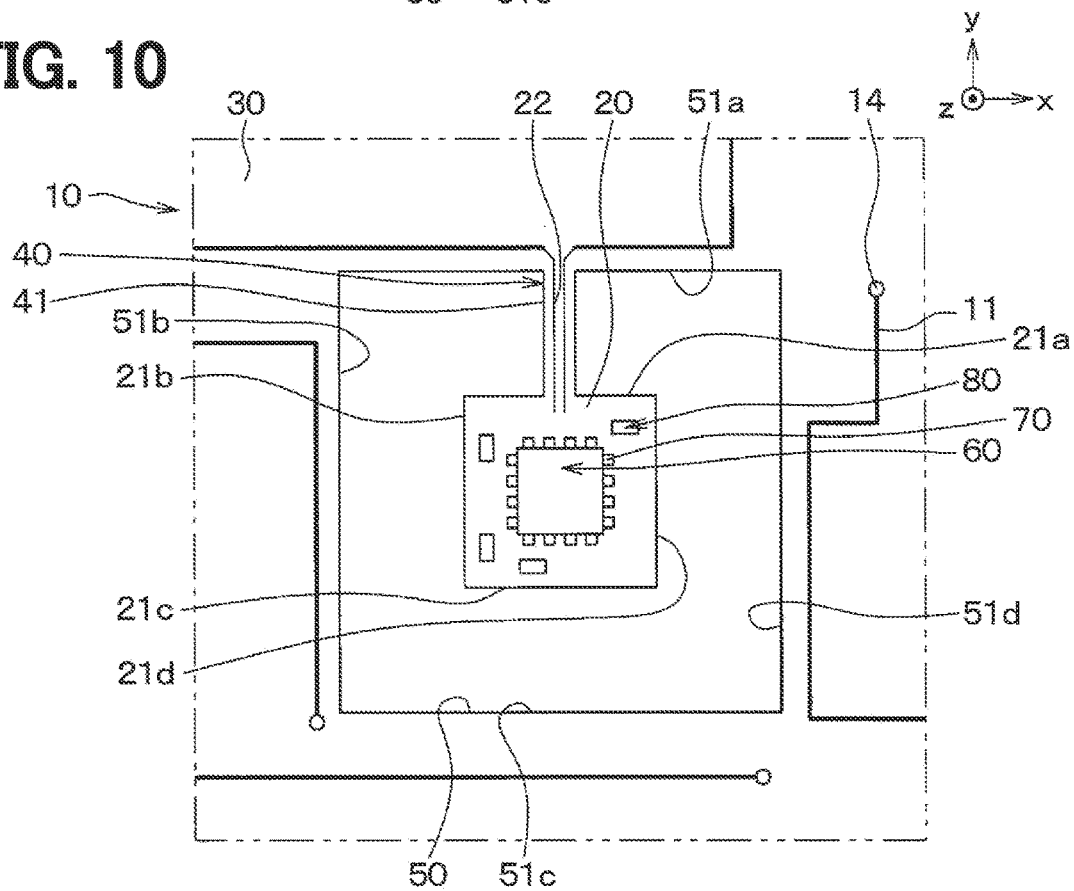
FIG. 10 is a plan view of an electronic device of a seventh embodiment.

In the present embodiment, as shown in FIG. 10, the supporting beam 40 is formed only of the first supporting beam portion 41. That is, the electronic device of the present embodiment does not include the second to fourth supporting beam portions 43 of the first embodiment. The component mounting portion 20 is supported by the peripheral portion 30 through the first supporting beam portion 41. The first supporting beam portion 41 supports only one end of the component mounting portion 20. Note that FIG. 10 corresponds to an enlarged view of the area II shown in FIG. 1.

Even when the supporting beam 40 formed of the first supporting beam portion 41 supports only one end of the component mounting portion 20 as in the present embodiment described above, similar advantages as those of the first embodiment can be obtained. Further, by supporting only one end of the component mounting portion 20, the number of connecting portions between the component mounting portion 20 and the peripheral portion 30 decreases. Therefore, it is possible to further inhibit the strain energy caused by the warp of the peripheral portion 30 of the printed circuit board 10 from propagating to the component mounting portion 20. Therefore, it is possible to further restrict the component mounting portion 20 from warping and further reduce the stress applied to the solder 70.

Eighth Embodiment

An eighth embodiment will be described hereafter. In this embodiment, the configurations of the component mounting portion 20 and the supporting beam 40 are changed from those in the first embodiment. The remaining configurations are similar to those of the first embodiment and will thus not be described repeatedly.

Figure 11:
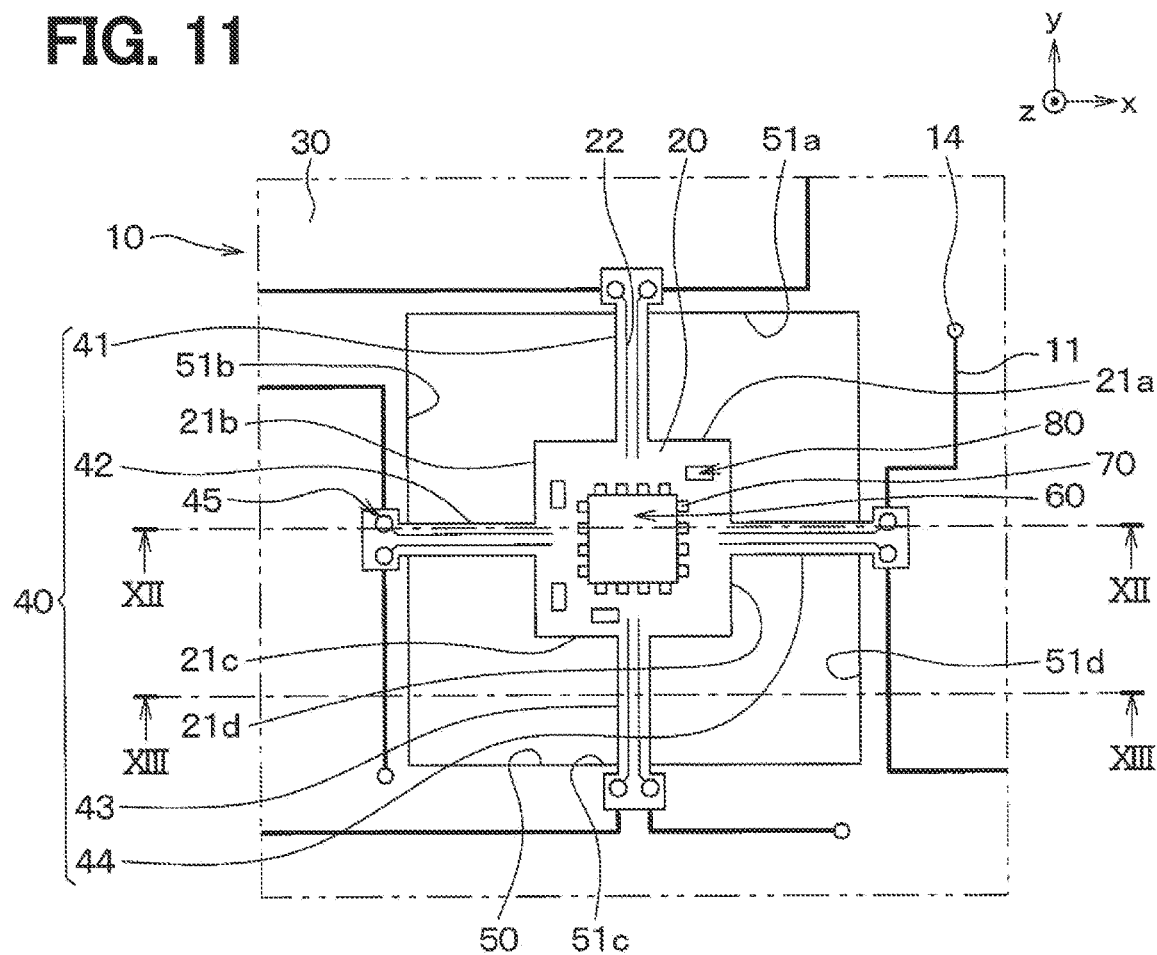
FIG. 11 is a plan view of an electronic device of an eighth embodiment.
Figure 12:
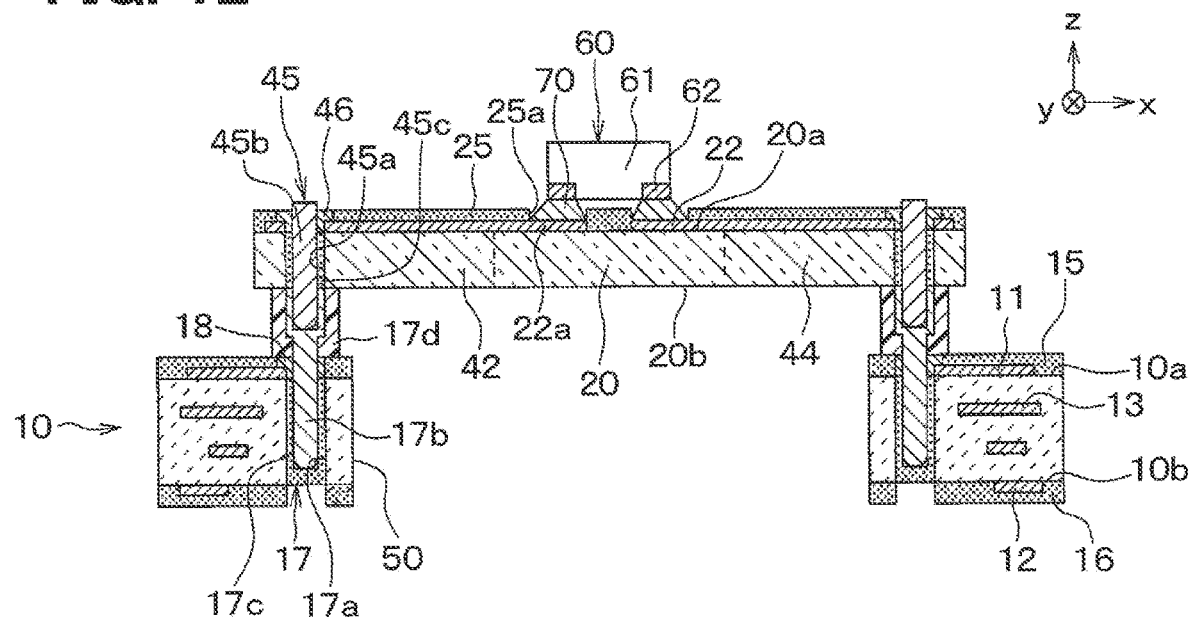
FIG. 12 is a cross-sectional view taken along a line XII-XII in FIG. 11.
Figure 13:
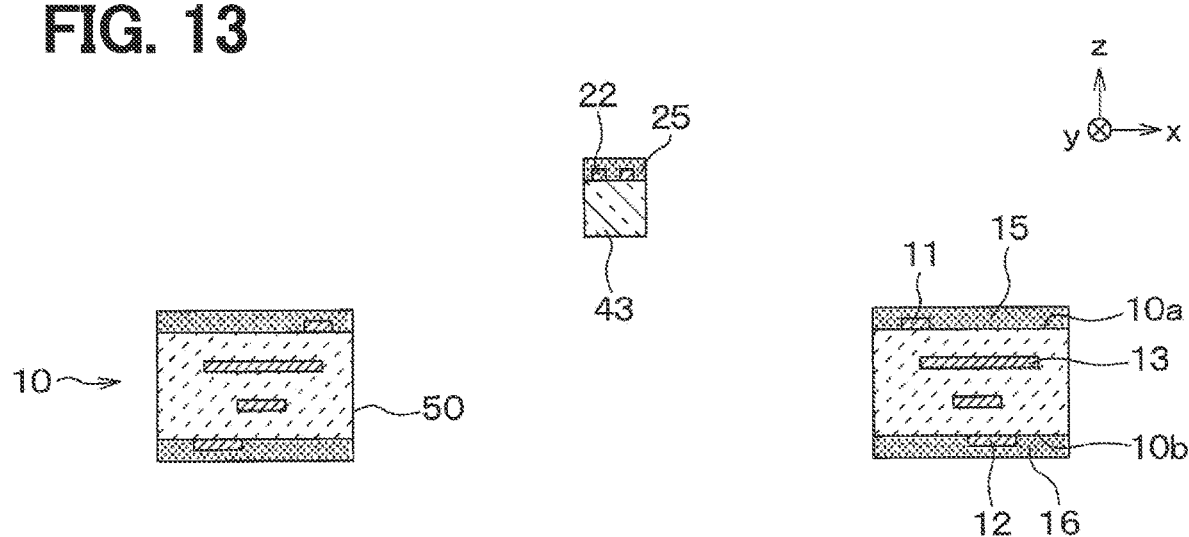
FIG. 13 is a cross-sectional view taken along a line XIII-XIII—in FIG. 11.

In this embodiment, as shown in FIGS. 11 to 13, the component mounting portion 20 is made of a material different from that of the printed circuit board 10. In the present embodiment, the component mounting portion 20 is made of a ceramic substrate having higher rigidity than the glass epoxy board constituting the printed circuit board 10. The component mounting portion 20 has one surface 20a on which the wiring pattern 22 and the insulating film 25 covering the wiring pattern 22 are formed. The insulating film 25 defines contact holes 25a through which the lands 22a of the wiring pattern 22 connected to the electronic component 60 is exposed.

The electronic component 60 is joined to the lands 22a formed on the component mounting portion 20 via a solder 70.

The first to fourth supporting beam portions 41 to 44 are integrally formed with the component mounting portion 20 in this embodiment. That is, in the present embodiment, the first to fourth supporting beam portions 41 to 44 are composed of a part of the ceramic substrate. The wiring pattern 22 formed on the component mounting portion 20 appropriately extends to the first to fourth supporting beam portions 41 to 44. FIG. 12 is a cross-sectional view taken along the line XII-XII in FIG. 11, and the line XII-XII does not pass through the wiring pattern 22 formed on the second and fourth supporting beam portions 42 and 44. However, for descriptive purpose, the wiring pattern 22 is illustrated in the cross-sectional view.

The first supporting beam portion 41 extends from the center portion of the first mounting portion side 21a in the y-axis direction. The second supporting beam portion 42 extends from the center portion of the second mounting portion side 21b in the x-axis direction. The third supporting beam portion 43 extends from the center portion of the third mounting portion side 21c in the y-axis direction. The fourth supporting beam portion 44 extends from the center portion of the fourth mounting portion side 21d in the x-axis direction.

In the present embodiment, the first to fourth supporting beam portions 41 to 44 are arranged to be point-symmetrical with respect to the center of the component mounting portion 20. Further, the first to fourth supporting beam portions 41 to 44 are arranged so as to be line-symmetrical with respect to a virtual line extending in the x-axis direction and passing through the center of the component mounting portion 20 and a virtual line extending in the y-axis direction and passing through the center of the component mounting portion 20.

As will be described later, when the component mounting portion 20 is arranged such that the center of the component mounting portion 20 is substantially the same as the center of the board through-hole 50, the end of each of the first to fourth supporting beam portions 41 to 44 away from the component mounting portion overlaps with the printed circuit board 10 in the normal direction.

The end of each of the first to fourth supporting beam portions 41 to 44 away from the component mounting portion 20 has a beam connecting portion 45. The beam connecting portion 45 has holes 45a and male connecting pins 45b arranged in the holes 45a. The connection pins 45b are arranged to extend beyond both opening ends of the holes 45a. The connecting pins 45b are fixed by fixing members 45c such as an adhesive arranged in the holes 45a.

Further, the wiring pattern 22 formed on each of the first to fourth supporting beam portions 41 to 44 appropriately extends to the vicinity of the holes 45a. A solder 46 is arranged on an opening side of the holes 45a defined on the one surface 20a of the component mounting portion 20 to electrically connect the connecting pins 45b and the wiring pattern 22. As a result, the electronic component 60 is electrically connected to the connecting pins 45b via the wiring pattern 22.

The printed circuit board 10 includes the board through-hole 50 similar to the above. Board connecting portions 17 are formed around the board through-hole 50. The printed circuit board 10 of the present embodiment has a configuration having only the peripheral portion 30 as compared with the first embodiment.

Then, the component mounting portion 20 and the first to fourth supporting beam portions 41 to 44 are arranged such that the center of the component mounting portion 20 is substantially the same as the center of the board through-hole 50 and the beam connecting portions 45 formed in the first to fourth supporting beam portions 41 to 44 overlap with the printed circuit board 10.

Specifically, the printed circuit board 10 includes the board connecting portions 17 at positions corresponding to the beam connecting portions 45 formed in the first to fourth supporting beam portions 41 to 44. The board connecting portions 17 has holes 17a passing through the printed circuit board 10 and female connecting pins 17b disposed in the holes 17a.

The connecting pins 17b are arranged in the holes 17a to extend beyond the one surface 10a of the printed circuit board 10. The connecting pins 17b are fixed by fixing members 17c such as an adhesive arranged in the holes 17a. Further, an insulating resin member 17d is arranged around the extending portions of the connecting pins 17b beyond the printed circuit board 10.

Further, the wiring pattern 22 formed on the one surface 10a of the printed circuit board 10 appropriately extends to the vicinity of the holes 17a. Solders 18 are arranged on opening sides of the holes 17a defined on the one surface 10a of the printed circuit board 10 to electrically connect the connecting pins 17b and the wiring pattern 11.

The component mounting portion 20 is arranged on the printed circuit board 10 so that the connecting pins 45b of the beam connecting portions 45 are engaged with the connecting pins 17b of the board connecting portions 17. As a result, the component mounting portion 20 and the printed circuit board 10 are mechanically and electrically connected with each other. In the electronic device of the present embodiment, since the printed circuit board 10, the component mounting portion 20, and the first to fourth supporting beam portions 41 to 44 are configured as described above, they are not located on the same surface.

In the present embodiment described above, the printed circuit board 10 defines the board through-hole 50. Therefore, firstly, when the printed circuit board 10 warps around the x-axis direction or the y-axis direction, this warp is divided by the board through-hole 50. Therefore, the printed circuit board 10 can reduce the warp around the board through-hole 50 (that is, the portion where the board connecting portions 17 are arranged) as compared with the case where the board through-hole 50 is not defined in the printed circuit board 10. That is, when the printed circuit board 10 warps, the strain energy due to the warp that may propagate to the component mounting portion 20 via the board connecting portions 17 can be reduced.

The component mounting portion 20 is supported by the printed circuit board 10 via the first to fourth supporting beam portions 41 to 44, the beam connecting portions 45, and the board connecting portions 17. Therefore, when the printed circuit board 10 warps, the strain energy due to the warp is less likely to propagate through the board connecting portions 17, the first to fourth supporting beam portions 41 to 44, and the beam connecting portions 45. Therefore, the component mounting portion 20 can be prevented from warping, and similar advantages as those of the first embodiment can be obtained.

Further, the component mounting portion 20 and the supporting beam 40 are made of a material different from that of the printed circuit board 10. Therefore, the component mounting portion 20 can be made of a material suitable for the intended use, and the degree of freedom in design can be improved.

Further, in the present embodiment, the component mounting portion 20 and the supporting beam 40 are made of a ceramic substrate having higher rigidity than the printed circuit board 10. Therefore, even when the printed circuit board 10 warps, the supporting beam 40 and the component mounting portion 20 are less likely to warp. Therefore, the stress applied to the solder 70 can be further reduced.

Ninth Embodiment

A ninth embodiment will be described hereafter. The present embodiment is different from the eighth embodiment in that the printed circuit board 10 does not define the board through-hole 50. Other portions are similar to those in the eighth embodiment. Thus, descriptions thereof will be omitted.

Figure 14:
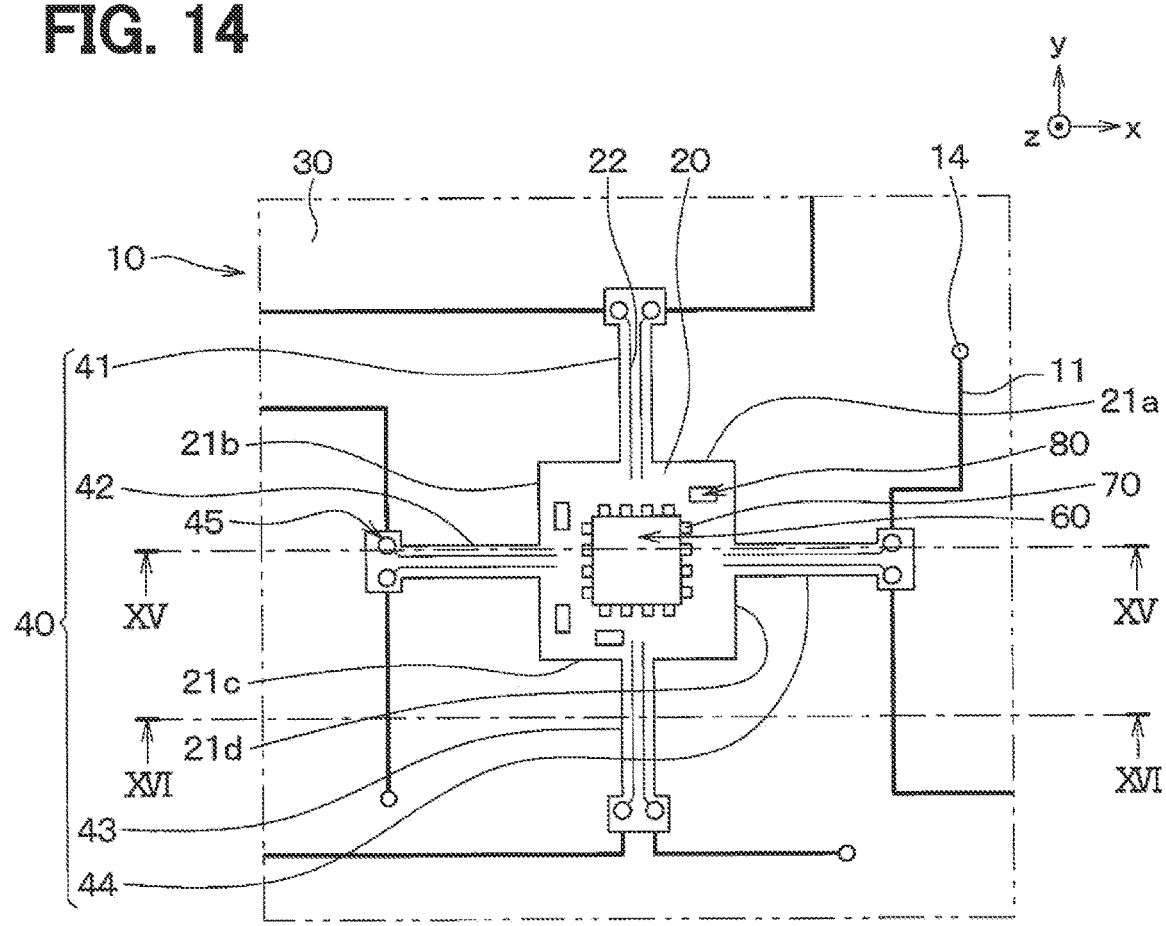
FIG. 14 is a plan view of an electronic device of a ninth embodiment.
Figure 15:
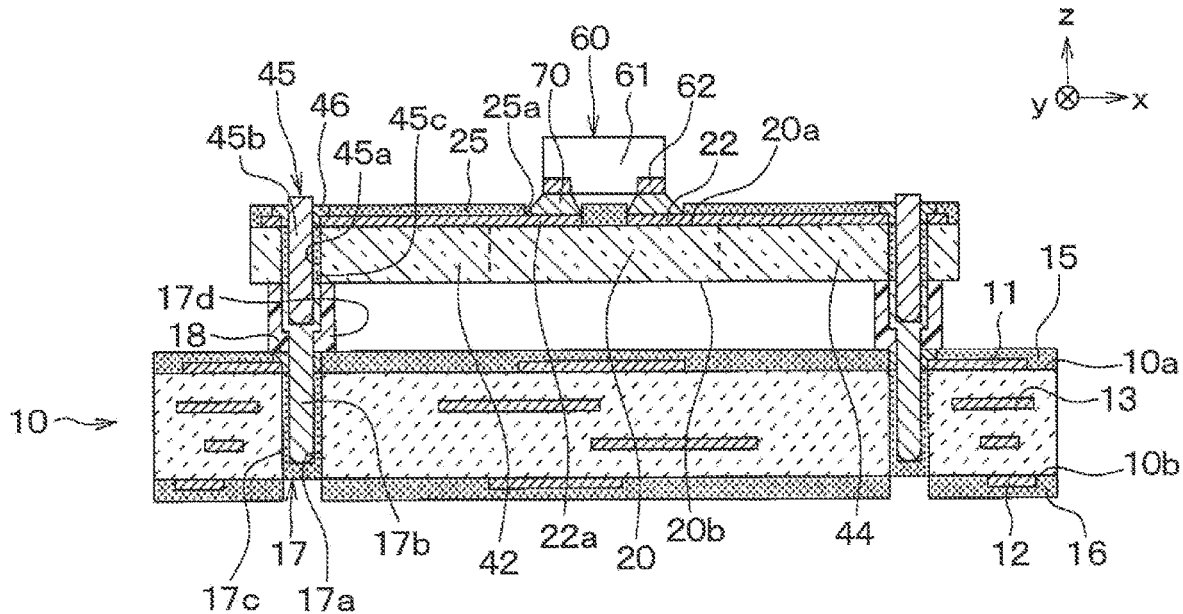
FIG. 15 is a cross-sectional view taken along a line XV-XV in FIG. 14.
Figure 16:
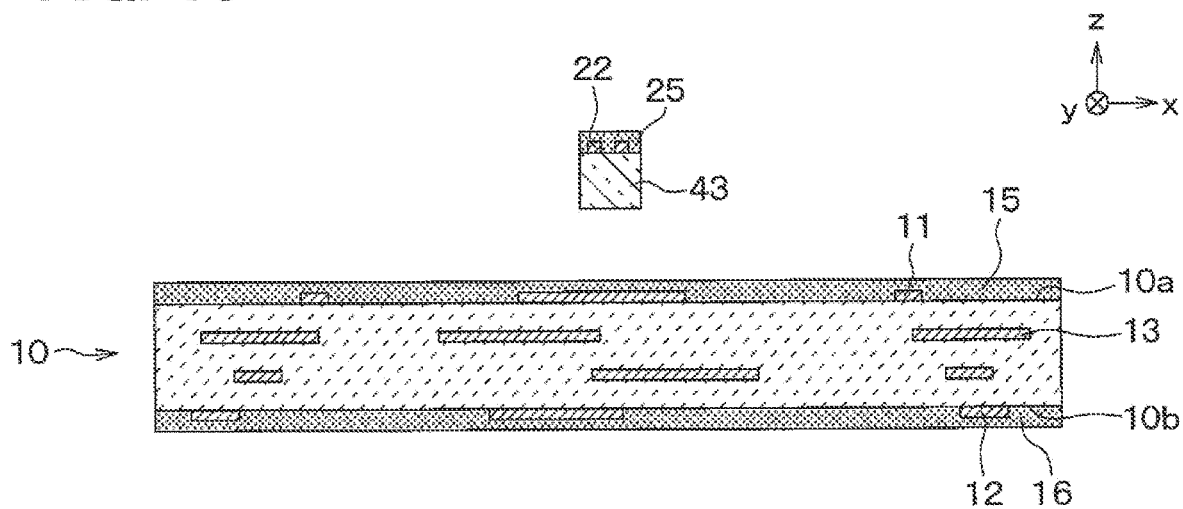
FIG. 16 is a cross-sectional view taken along a line XVI-XVI in FIG. 14.

In the present embodiment, as shown in FIGS. 14 to 16, the printed circuit board 10 does not define the board through-hole 50. Note that FIG. 14 corresponds to an enlarged view of the area II shown in FIG. 1. FIG. 15 is a cross-sectional view taken along the line XV-XV in FIG. 14, and the line XV-XV does not pass through the wiring pattern 22 formed on the second and fourth supporting beam portions 42 and 44. However, for descriptive purpose, the wiring pattern 22 is illustrated in the cross-sectional view.

The printed circuit board 10 includes the board connecting portions 17 at positions corresponding, in the normal direction, to the beam connecting portions 45 formed in the first to fourth supporting beam portions 41 to 44.

In the present embodiment described above, the board through-hole 50 is not defined in the printed circuit board 10, but the component mounting portion 20 is supported by the printed circuit board 10 through the first to fourth supporting beam portions 41 to 44, the beam connecting portions 45, and the board connecting portions 17. For those reasons, similar advantages as those of the eighth embodiment can be obtained.

Tenth Embodiment

A tenth embodiment will be described hereafter. In the present embodiment, the configuration of the supporting beam 40 is changed from that of the ninth embodiment. Other portions are similar to those in the ninth embodiment, and descriptions thereof will be omitted.

Figure 17:
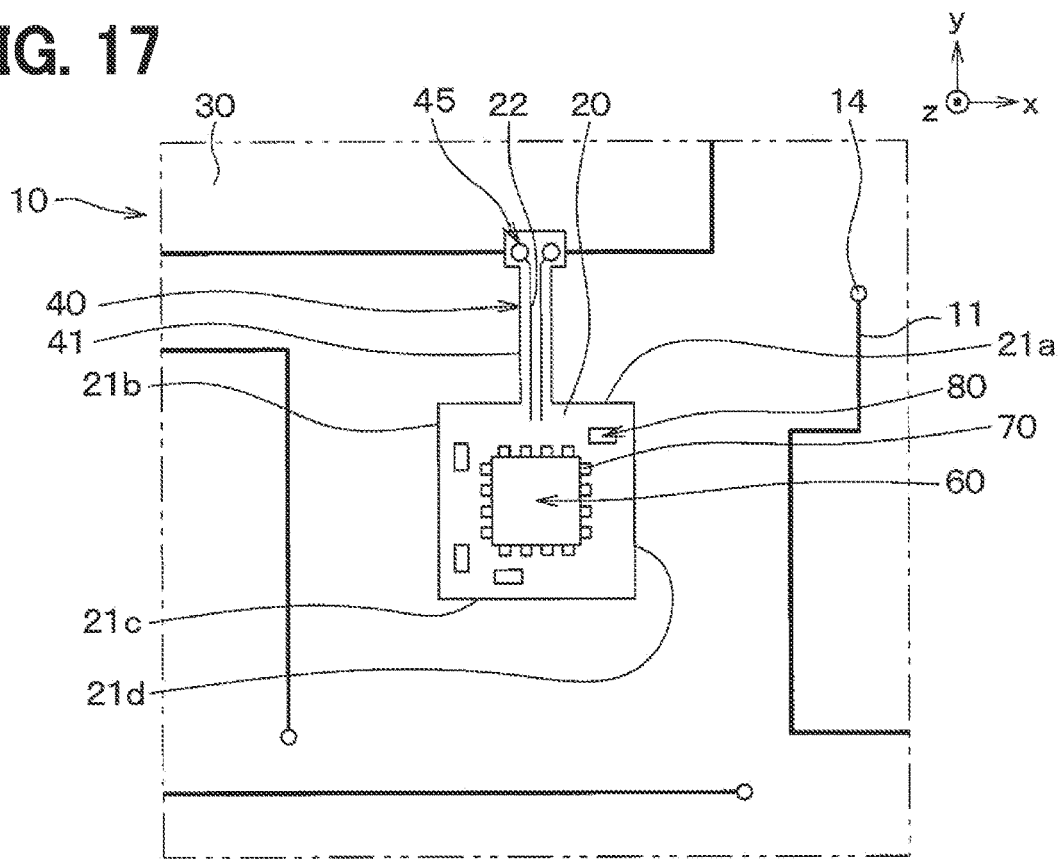
FIG. 17 is a plan view of an electronic device of a tenth embodiment.

In the present embodiment, as shown in FIG. 17, the supporting beam 40 includes only the first supporting beam portion 41. That is, the electronic device of the present embodiment does not include the second to fourth supporting beam portions 42 to 44 described in the ninth embodiment. Only one end of the component mounting portion 20 is supported by the printed circuit board 10 through the first supporting beam portion 41. Note that FIG. 17 corresponds to an enlarged view of the area II shown in FIG. 1.

Even when the supporting beam 40 is formed only of the first supporting beam portion 41 and only one end of the component mounting portion 20 is supported through the first supporting beam portion 41, similar advantages to those of the above described in the ninth embodiment can be obtained. Further, since only one end of the component mounting portion 20 is supported, the number of connecting portions between the component mounting portion 20 and the printed circuit board 10 can be reduced. Therefore, it is possible to further inhibit the strain energy caused by the warp of the peripheral portion 30 of the printed circuit board 10 from propagating to the component mounting portion 20. Therefore, it is possible to further restrict the component mounting portion 20 from warping and further reduce the stress applied to the solder 70.

In the above description, an example in which the supporting beam 40 is formed only of the first supporting beam portion 41 has been described. However, the supporting beam 40 may be formed of two supporting beam portions of the first supporting beam portion 41 and the third supporting beam portion 43. That is, the supporting beam 40 does not necessary have all of the first to fourth supporting beam portions 41 to 44.

Eleventh Embodiment

An eleventh embodiment will be described hereafter. In this embodiment, the bent portion C is provided with respect to the tenth embodiment. Other configurations are the same as those of the tenth embodiment, and therefore a description of the same configurations will be omitted.

Figure 18:
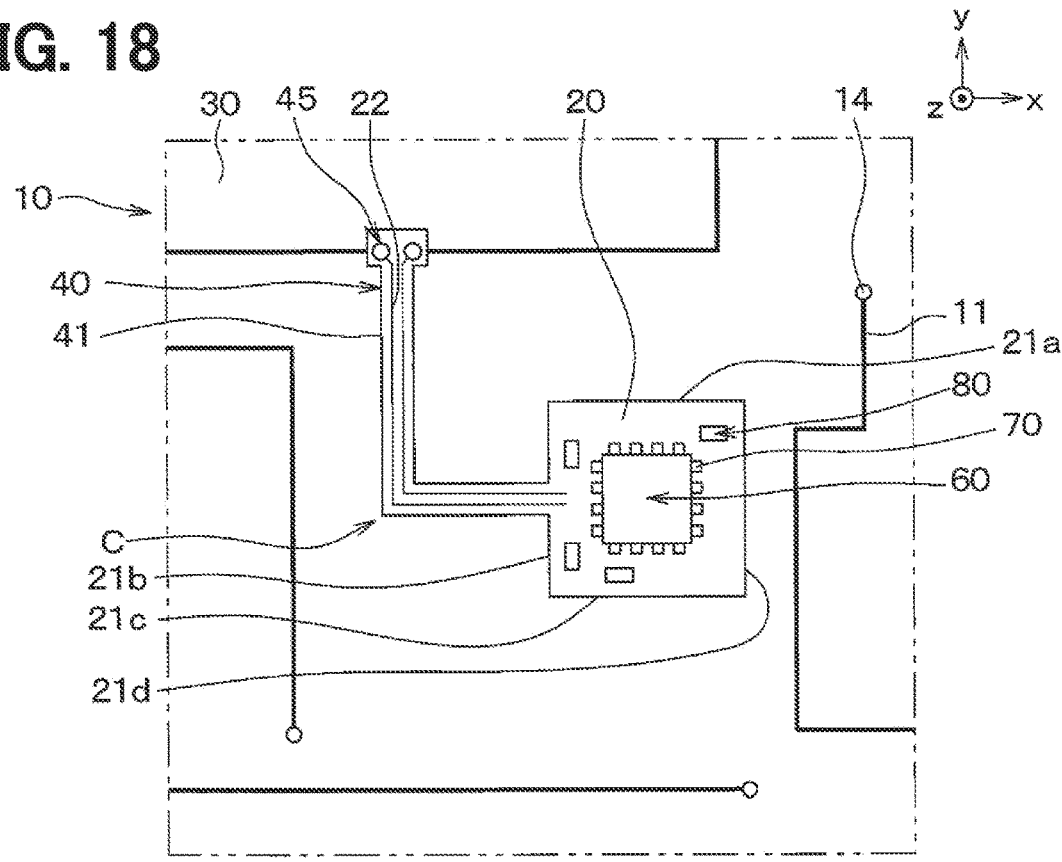
FIG. 18 is a plan view of an electronic device of an eleventh embodiment.

In the present embodiment, as shown in FIG. 18, the supporting beam 40 is formed only of the first supporting beam portion 41. The first supporting beam portion 41 of the present embodiment has a bent portion C at which the extending direction of the first supporting beam portion 41 is changed by 90 degrees. That is, the first supporting beam portion 41 has a substantially L-shape when viewed in the normal direction. One end of the first supporting beam portion 41 away from the beam connecting portion 45 is connected to the second mounting portion side 21b of the component mounting portion 20. Note that FIG. 18 corresponds to an enlarged view of the area II shown in FIG. 1.

In the present embodiment described above, the first supporting beam portion 41 has the bent portion C. Therefore, when the printed circuit board 10 warps, the strain energy propagating from the printed circuit board 10 through the first supporting beam portion 41 is likely to be concentrated on the bent portion C, and is less likely to propagate to the component mounting portion 20. Therefore, it is possible to further restrict the component mounting portion 20 from warping and further reduce the stress applied to the solder 70.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various combinations and configurations, which are preferred, other combinations and configurations, including more, less or only a single element, are also within the spirit and scope of the present disclosure.

For example, in each of the above embodiments, the printed circuit board 10 as the mounting base member may be made of a ceramic board or the like instead of the glass epoxy board.

Further, in each of the above embodiments, the shape of the component mounting portion 20 can be appropriately changed. For example, the component mounting portion 20 may have a circular shape as described in the fifth embodiment, a triangular shape, or a polygonal shape such as a pentagon or more. Similarly, in the first to eighth embodiments, the opening shape of the board through-hole 50 can be appropriately changed. For example, the board through-hole 50 may have a circular shape as in the fifth embodiment, or may have a triangular shape or a polygonal shape such as a pentagon or more.

Further, in the first to sixth, eighth, and ninth embodiments, the supporting beam 40 do not have to be arranged point-symmetrically with respect to the center of the component mounting portion 20. Further, the supporting beam 40 do not have to be arranged symmetrically with respect to the virtual line passing through the center of the component mounting portion 20 and extending along the x-axis direction or the virtual line passing through the center of the component mounting portion 20 extending along the y-axis direction. For example, in the first embodiment, the first to fourth supporting beam portions 41 to 44 may not be arranged point-symmetrically or line-symmetrically by changing the connecting positions of the first to fourth supporting beam portions 41 to 44 with the first to fourth mounting portion sides 21a to 21d and the hole portion sides 51a to 51d. Further, for example, in the sixth embodiment, the supporting beam 40 may be formed of two supporting beam portions of the first supporting beam portion 41 and the second supporting beam portion 42.

Further, in the first, third to fifth, eighth, and ninth embodiments, the first to fourth supporting beam portions 41 to 44 do not have to have the same shapes and the same dimensions. Similarly, in the sixth embodiment, the first and third supporting beam portions 41 and 43 do not have to have the same shapes and the same dimensions. Further, in the first to eleventh embodiments, the through-via 14 may be defined in the component mounting portion 20.

In the eighth to eleventh embodiments, the component mounting portion 20 and the printed circuit board 10 may be fixed as follows. For example, the connection pins 45b may be a female type and the connection pins 17b may be a male type. Alternatively, for example, a common pin may be inserted through the hole 45a defined in the supporting beam 40 and the hole 17a defined in the printed circuit board 10.

Further, the above embodiments may be combined together as appropriate. For example, the second to seventh embodiments may be appropriately combined with the eighth to eleventh embodiments so that the shape of the supporting beam 40 may be changed. Further, the eighth embodiment may be combined with the tenth and eleventh embodiments so that the board through-hole 50 may be defined in the printed circuit board 10. Further, a combination of the above embodiments may be further combined.

What is claimed is:

1. An electronic device comprising:
a component mounting portion;
an electronic component disposed on the component mounting portion;
a solder between the component mounting portion and the electronic component;
a mounting base member mounted in a housing; and
a supporting beam connecting the component mounting portion and the mounting base member such that the component mounting portion is supported by the mounting base member via the supporting beam, wherein
the supporting beam has a plurality of bent portions that are bent,
the supporting beam includes:
a frame surrounding the component mounting portion and including at least one of the plurality of bent portions;
an outer supporting portion connecting the frame and the mounting base member; and
an inner supporting portion connecting the frame and the component mounting portion, the inner supporting portion being shifted from the outer supporting portion along the frame,
one of the plurality of bent portions is a connecting portion between the frame and the outer supporting portion, and
another of the plurality of bent portions is a connecting portion between the frame and the inner supporting portion.

2. The electronic device according to claim 1, wherein
the mounting base member defines a board through-hole passing through the mounting base member in a thickness direction, and
the component mounting portion is disposed in the board through-hole in a normal direction relative to a surface direction of the mounting base member.

3. The electronic device according to claim 1, wherein
the supporting beam supports opposite ends of the component mounting portion.

4. The electronic device according to claim 3, wherein
the supporting beam has a symmetry shape, and
the symmetry shape is at least one of a point symmetry shape relative to a center of the component mounting portion or a line symmetry shape relative to a virtual line passing through the center of the component mounting portion.

5. The electronic device according to claim 1, wherein
the supporting beam supports only one end of the component mounting portion.

6. The electronic device according to claim 1, wherein
the component mounting portion and the supporting beam are made of a same material with a material of the mounting base member and integrally formed with the mounting base member.

7. The electronic device according to claim 1, wherein
the component mounting portion and the supporting beam are made of a material different from a material of the mounting base member.

8. The electronic device according to claim 7, wherein
the material of the component mounting portion has a rigidity higher than that of the material of the mounting base member.

9. An electronic device comprising:
a component mounting portion;
an electronic component disposed on the component mounting portion;
a solder between the component mounting portion and the electronic component;
a mounting base member mounted in a housing; and
a supporting beam connecting the component mounting portion and the mounting base member such that the component mounting portion is supported by the mounting base member via the supporting beam, wherein
the supporting beam has a plurality of supporting beam portions each having three bent portions, and
an extending direction of each of the plurality of supporting beam portions is changed by 90 degrees at the three bent portions.

10. The electronic device according to claim 9, wherein
the supporting beam has the plurality of supporting beam portions,
each of the plurality of supporting beam portions has a same shape and a same dimension,
the supporting beam has a symmetry shape, and the symmetry shape is at least one of a point symmetry shape relative to a center of the component mounting portion or a line symmetry shape relative to a virtual line passing through the center of the component mounting portion.

\* \* \* \* \*